United States Patent
He et al.

(10) Patent No.: US 11,192,189 B2
(45) Date of Patent: Dec. 7, 2021

(54) COATED TOOL AND CUTTING TOOL INCLUDING SAME

(71) Applicant: KYOCERA CORPORATION, Kyoto (JP)

(72) Inventors: Dan He, Saitama (JP); Tsuyoshi Yamasaki, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 44 days.

(21) Appl. No.: 16/618,165

(22) PCT Filed: May 23, 2018

(86) PCT No.: PCT/JP2018/019884
§ 371 (c)(1),
(2) Date: Nov. 29, 2019

(87) PCT Pub. No.: WO2018/221355
PCT Pub. Date: Dec. 6, 2018

(65) Prior Publication Data
US 2020/0180039 A1    Jun. 11, 2020

(30) Foreign Application Priority Data
May 30, 2017    (JP) ............................. JP2017-106094

(51) Int. Cl.
*B23B 27/14*    (2006.01)
*C23C 14/06*    (2006.01)
(Continued)

(52) U.S. Cl.
CPC ........ *B23B 27/148* (2013.01); *C23C 14/0635* (2013.01); *C23C 14/0641* (2013.01);
(Continued)

(58) Field of Classification Search
CPC .............. B23B 27/148; C23C 14/0635; C23C 14/0641; C23C 14/0664; C23C 28/044; C23C 28/42
(Continued)

(56) References Cited

U.S. PATENT DOCUMENTS

2007/0269610 A1* 11/2007 Fukui .................. C23C 14/0641
427/497
2019/0040519 A1    2/2019 Sato et al.

FOREIGN PATENT DOCUMENTS

JP    2004050381 A    2/2004
JP    2007061993 A    3/2007
(Continued)

*Primary Examiner* — Archene A Turner
(74) *Attorney, Agent, or Firm* — Vierig, Jentschura & Partner MBB

(57) ABSTRACT

A coated tool may include a base member and a coating layer located on the base member. The coating layer may include a plurality of AlTi layers and a plurality of AlCr layers. The AlTi layers may include at least one kind selected from nitride, carbide or carbonitride, each including aluminum and titanium. The AlCr layers may include at least one kind selected from nitride, carbide or carbonitride, each including aluminum and chromium. The coating layer may include a laminate structure in which the AlTi layers and the AlCr layers are alternately laminated one upon another. The AlCr layers may include a first AlCr layer and a second AlCr layer located farther away from the base member than the first AlCr layer. A content ratio of chromium in the second AlCr layer may be higher than a content ratio of chromium in the first AlCr layer.

6 Claims, 7 Drawing Sheets

(51) Int. Cl.
*C23C 28/04* (2006.01)
*C23C 28/00* (2006.01)

(52) U.S. Cl.
CPC ........ *C23C 14/0664* (2013.01); *C23C 28/044* (2013.01); *C23C 28/42* (2013.01)

(58) Field of Classification Search
USPC .................... 51/307, 309; 428/697, 698, 699
See application file for complete search history.

(56) References Cited

FOREIGN PATENT DOCUMENTS

| | | | |
|---|---|---|---|
| JP | 2007-111815 | * | 5/2007 |
| JP | 2011-011286 | * | 1/2011 |
| JP | 2014091169 A | | 5/2014 |
| JP | 2017042906 A | | 3/2017 |
| JP | 2017154200 A | | 9/2017 |

* cited by examiner

COATED TOOL AND CUTTING TOOL INCLUDING SAME

CROSS-REFERENCE TO RELATED APPLICATIONS

This application is a national stage entry according to 35 U.S.C. 371 of PCT Application No. PCT/JP2018/019884 filed on May 23, 2018, which claims priority to Japanese Application No. 2017-106094 filed on May 30, 2017, which are entirely incorporated herein by reference.

TECHNICAL FIELD

The present disclosure relates to a coated tool for use in a cutting process.

BACKGROUND

As a coated tool for use in a cutting process, such as a turning process and a milling process, a surface coated cutting tool (coated tool) may be discussed, for example, in Patent Document 1 (Japanese Unexamined Patent Publication No. 2017-042906). The coated tool discussed in Patent Document 1 may include a tool base member and a hard coating layer in which an A layer represented by $(Ti_{1-z}Al_z)N$ and a B layer represented by $(Cr_{1-x-y}Al_xM_y)N$ are alternately laminated one upon another on a surface of the tool base member. Here, values of x and y each indicating a content ratio in terms of atomic ratio of Cr, Al and M in the B layer may be $0.03 \leq x \leq 0.4$ and $0 \leq y \leq 0.05$, and a content ratio of Cr may be 0.55-0.97.

A high content ratio of Cr in the layer (B layer) including Cr and Al may degrade toughness in the B layer, and consequently the coating layer is likely to separate from the tool main body. A low content ratio of Cr may degrade hardness in the B layer, and consequently wear of the coating layer is likely to occur. Accordingly, there is a desire for a coated tool having excellent adhesion and wear resistance.

SUMMARY

A coated tool in a non-limiting embodiment may include a base member and a coating layer located on the base member. The coating layer may include a plurality of AlTi layers, each including aluminum and titanium, and a plurality of AlCr layers, each including aluminum and chromium. The coating layer may include a laminate structure in which the AlTi layers and the AlCr layers are alternately laminated one upon another. The AlCr layers may include a first AlCr layer and a second AlCr layer located farther away from the base member than the first AlCr layer. A content ratio of chromium in the second AlCr layer may be higher than a content ratio of chromium in the first AlCr layer.

DETAILED DESCRIPTION

Figure 1:
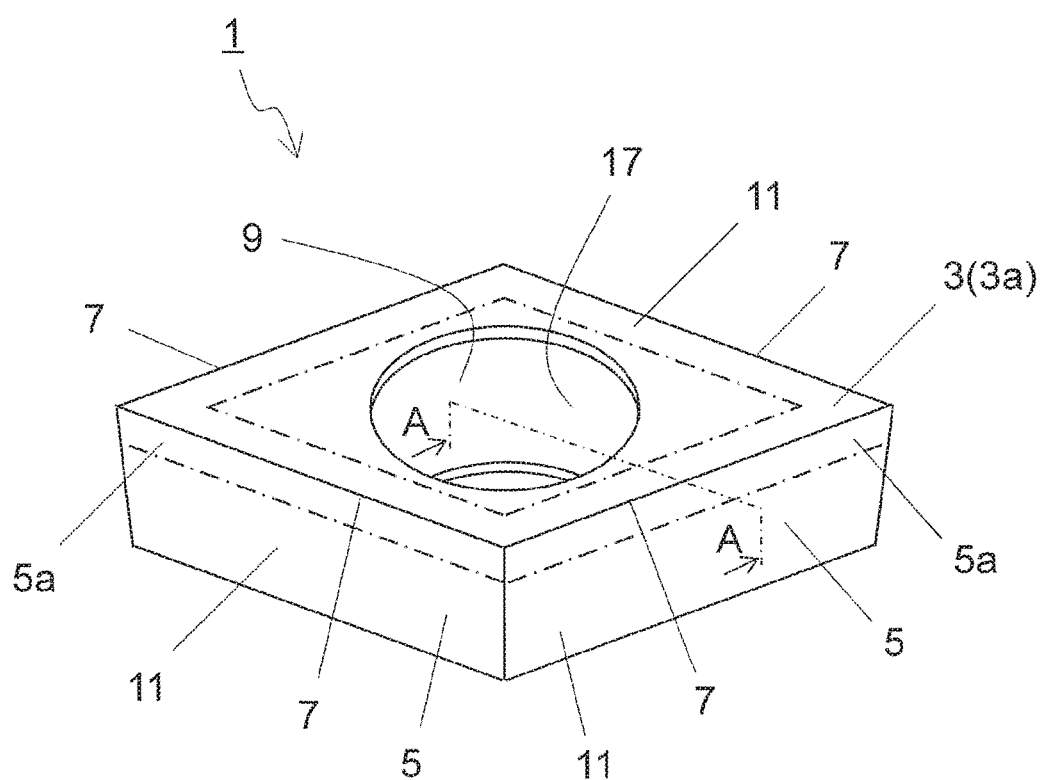
FIG. 1 is a perspective view illustrating a coated tool according to a non-limiting embodiment.
Figure 2:
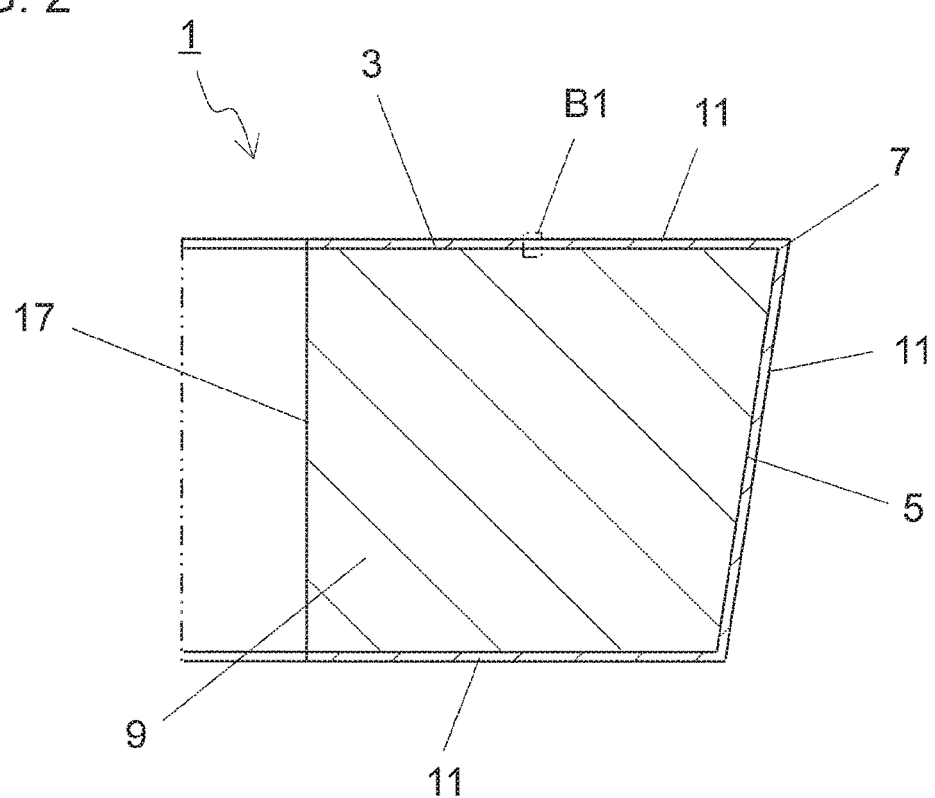
FIG. 2 is a sectional view taken along line A-A in the coated tool illustrated in FIG. 1.

A coated tool 1 according to a non-limiting embodiment is described in detail below with reference to the drawings. For the sake of description, the drawings referred to in the following illustrate, in a simplified form, only main members necessary for describing the non-limiting embodiments. The coated tool is therefore capable of including any arbitrary structural member not illustrated in the drawings referred to. Sizes of the members in each of the drawings faithfully represent neither sizes of actual structural members nor size ratios of these members.

The coated tool 1 in the non-limiting embodiment has a quadrangular plate shape and includes a first surface 3 (upper surface in FIG. 1) having a quadrangular shape, a second surface 5 (side surface in FIG. 1), and a cutting edge 7 located on at least a part of a ridge line where the first surface 3 intersects with the second surface 5.

The entirety of an outer periphery of the first surface 3 may correspond to the cutting edge 7 in the coated tool 1 of the non-limiting embodiment. The coated tool 1 is not limited to the above configuration. For example, the cutting edge 7 may be located on only one side or a part of the first surface 3 having the quadrangular shape.

The first surface 3 may at least partially include a rake surface region 3a. A region in the first surface 3 which is located along the cutting edge 7 serves as the rake surface region 3a in the non-limiting embodiments. The second surface 5 may include at least partially a flank surface region 5a. A region in the second surface 5 which is located along the cutting edge 7 serves as the flank surface region 5a in the non-limiting embodiments. In other words, the cutting edge 7 is located on an intersecting part of the rake surface region 3a and the flank surface region 5a.

A boundary between the rake surface region 3a and other region on the first surface 3 and a boundary between the flank surface region 5a and other region on the second surface 5 are indicated by a chain line in FIG. 1. Because FIG. 1 illustrates one non-limiting embodiment in which all the ridge line where the first surface 3 intersects with the second surface 5 serves as the cutting edge 7, FIG. 1 illustrates a ring-shaped chain line along the cutting edge 7 on the first surface 3.

A size of the coated tool 1 is not particularly limited. For example, a length of one side of the first surface 3 is settable to approximately 3-20 mm in the non-limiting embodiments. A height from the first surface 3 to a surface (a lower surface in FIG. 1) located on an opposite side of the first surface 3 is settable to approximately 5-20 mm.

The coated tool 1 includes the base member 9 having the quadrangular plate shape and a coating layer 11 that coats a surface of the base member 9 in the non-limiting embodiments. The coating layer 11 may cover the whole or only a part of the surface of the base member 9. If the coating layer 11 covers only the part of the base member 9, it can be said that the coating layer 11 is located on at least the part of the base member 9.

The coating layer 11 is located on at least the rake surface region 3a along the cutting edge 7 on the first surface 3 and the flank surface region 5a along the cutting edge 7 on the second surface 5 in the non-limiting embodiments. FIG. 1 illustrates the non-limiting embodiment in which the coating layer 11 is located on the entirety of the first surface 3 including the rake surface region 3a and the entirety of the second surface 5 including the flank surface region 5a. A thickness of the coating layer 11 is settable to, for example, approximately 0.1-10 μm. The thickness of the coating layer 11 may be constant or may be changed depending on location.

Figure 3:
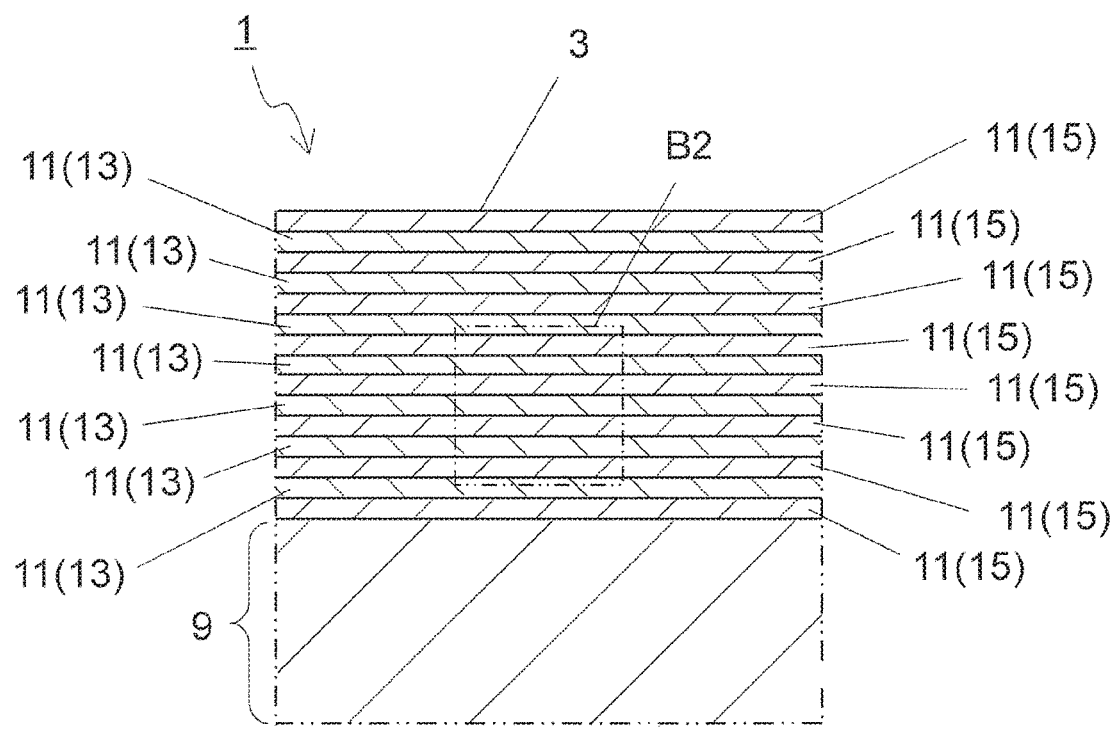
FIG. 3 is an enlarged view of a region B1 illustrated in FIG. 2.
Figure 4:
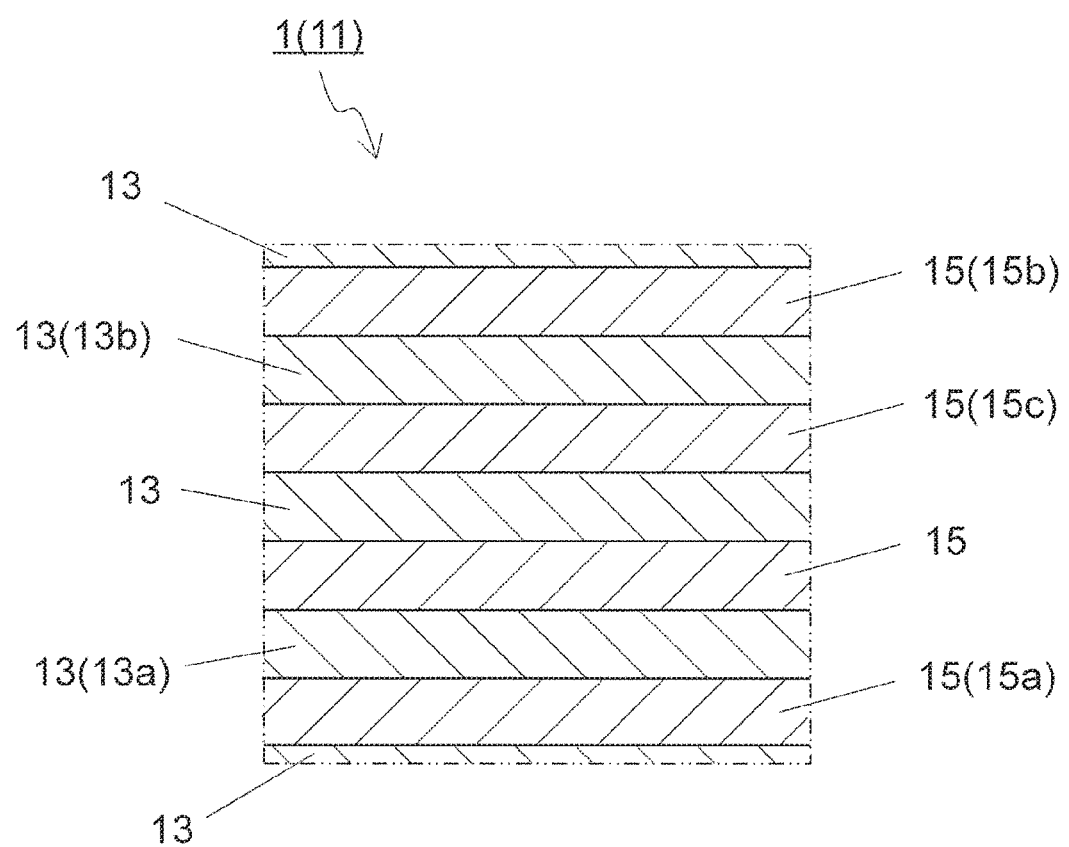
FIG. 4 is an enlarged view of a region B2 illustrated in FIG. 3.

The coating layer 11 includes a plurality of AlTi layers 13 and a plurality of AlCr layers 15 as illustrated in FIGS. 3 and 4. The AlTi layers 13 includes at least one kind selected from nitride, carbide and carbonitride, each including aluminum and titanium. The AlCr layer 15 includes a plurality of AlCr layers 15 including at least one kind selected from nitride, carbide and carbonitride, each including aluminum and chromium.

If the AlTi layer 13 is a nitride, it can be represented as AlTiN. If the AlTi layer 13 is a carbonitride, it can be represented as AlTiCN. A ratio of C and N in AlTiCN may be any one other than 1:1.

Similarly, if the AlCr layer 15 is a nitride, it can be represented as AlCrN. If the AlCr layer 15 is a carbonitride, it can be represented as AlCrCN. A ratio of C and N in AlCrCN may be any one other than 1:1.

The coating layer 11 includes a laminate structure in which a plurality of AlTi layers 13 and a plurality of AlCr layers 15 are alternately laminated one upon another. The laminate structure of the coating layer 11 is evaluable by a cross-sectional measurement using Scanning Electron Microscopy (SEM) or Transmission Electron Microscopy (TEM).

The AlTi layer 13 may include a metal component, such as Si, Nb, Hf, V, Ta, Mo, Zr, Cr and W, in addition to aluminum and titanium. Content ratios of aluminum and titanium are higher than that of the metal component. Because of the higher content ratios of aluminum and titanium than the metal component, it can be considered that the AlTi layer 13 includes aluminum and titanium as a main component. The term "content ratio" indicates a content ratio in terms of atomic ratio.

The AlCr layer 15 may include a metal component, such as Nb, Hf, V, Ta, Mo, Zr, Ti and W, in addition to aluminum and chromium. Content ratios of aluminum and chromium are higher than that of the metal component. Because of the higher content ratios of aluminum and chromium than the metal component, it can be considered that the AlCr layer 15 includes aluminum and chromium as a main component.

Compositions of the AlTi layer 13 and the AlCr layer 15 are measurable using energy dispersive X-ray spectroscopy (EDS) or X-ray photoelectron spectroscopy (XPS).

The number of the AlTi Layer 13 and the number of the AlCr layer 15 are not limited to a specific value. The number of the AlTi Layer 13 and the number of the AlCr layer 15 may be individually two or more. The number of the AlTi Layer 13 and the number of the AlCr layer 15 are settable to, for example, 2 to 500.

A thickness of the AlTi Layer 13 and a thickness of the AlCr layer 15 are not limited to a specific value, but are individually settable to 5-100 nm. The thicknesses of the AlTi layers 13 and the thicknesses of the AlCr layers 15 may be constant or different from each other.

Figure 5:
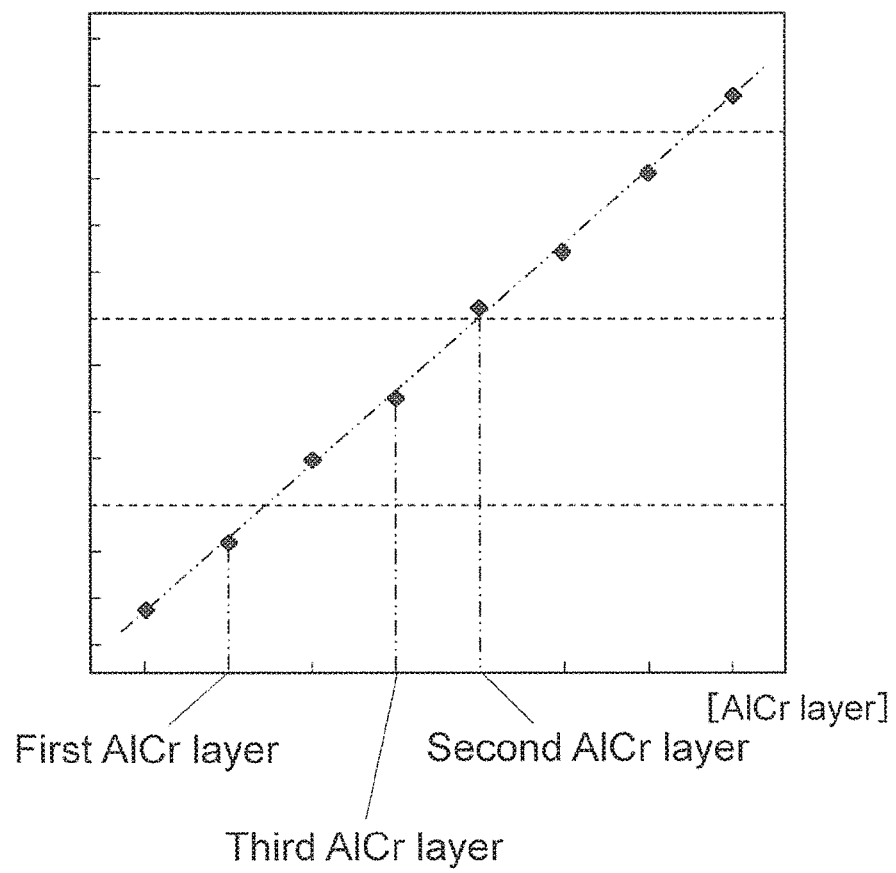
FIG. 5 is a graph indicating content ratios of chromium in the coated tool illustrated in FIG. 1.

The AlCr layers 15 include a first AlCr layer 15a and a second AlCr layer 15b as illustrated in FIG. 4 in the non-limiting embodiments. The second AlCr layer 15b is located farther away from the base member 9 than the first AlCr layer 15a. As illustrated in FIG. 5, a content ratio of chromium in the second AlCr layer 15b is higher than a content ratio of chromium in the first AlCr layer 15a.

The AlCr layer 15 has small residual stress if the content ratio of chromium is low. The AlCr layer 15 has high hardness if the content ratio of chromium is high.

The coating layer 11 is less likely to separate from the base member 9 because the content ratio of Cr in the first AlCr layer 15a, which is located closer to the base member 9 than the second AlCr layer 15b, is relatively low in the non-limiting embodiments.

Wear of the coating layer is less likely to proceed because a content ratio of Cr in the second AlCr layer 15b, which is located farther away from the base member 9 than the first AlCr layer 15a, is relatively high in the non-limiting embodiments.

Consequently, the coated tool 1 has excellent adhesion and wear resistance in the non-limiting embodiments.

In FIG. 5, an abscissa axis indicates positions of the AlCr layers 15 from the base member 9, specifically, indicates at what place the AlCr layer 15 exists from a side of the base member 9, and an ordinate indicates content ratios of Cr.

The AlCr layers 15 may further include a third AlCr layer 15c located between the first AlCr layer 15a and the second AlCr layer 15b in addition to the first AlCr layer 15a and the second AlCr layer 15b as illustrated in FIG. 4. The coating layer 11 includes three or more AlCr layers 15, and the AlTi layer 13 is located between the first AlCr layer 15a and the third AlCr layer 15c, and between the third AlCr layer 15c and the second AlCr layer 15b in FIG. 4.

Additionally, in cases where the coating layer 11 includes the third AlCr layer 15c, durability of the coating layer 11 can be enhanced if a content ratio of chromium in the third AlCr layer 15c is higher than a content ratio of chromium in the first AlCr layer 15a and is lower than a content ratio of chromium in the second AlCr layer 15b.

This is because the content ratios of chromium in the AlCr layers 15 including the first AlCr layer 15a, the second AlCr layer 15b and the third AlCr layer 15c are gently changed stepwise to avoid a rapid change. It is therefore possible to avoid rapid changes of toughness and hardness in the AlCr layers 15. This makes it easier to avoid occurrence of cracks due to stress concentration in the coating layer 11.

In cases where the coating layer 11 includes four or more AlCr layers 15, the coating layer 11 has further enhanced durability while keeping the excellent adhesion and wear resistance if the AlCr layers 15 are configured so that the AlCr layer 15 located farther away from the base member 9 has a higher content ratio of chromium. This is because it becomes easy to ensure that the content ratio of chromium in one of the AlCr layers 15 which is located closest to the base member 9 is extremely low, and the content ratio of chromium in one of the AlCr layers 15 which is located farthest away from the base member 9 is extremely high, while avoiding the rapid change of the toughness and hardness in the AlCr layers 15.

Particularly, as illustrated in FIG. 5, the AlCr layers 15 may include a region where the content ratios of chromium in the AlCr layers 15 become higher as located farther away from the base member 9 so as to be expressed by arithmetic progression. In this case, the coating layer 11 has excellent adhesion and wear resistance, and the coating layer 11 has further enhanced durability. This is because differences between the content ratios of chromium in the AlCr layers 15 adjacent to each other with the AlTi layer 13 interposed therebetween in a thickness direction become approximately constant. It is therefore possible to avoid the rapid change in content ratio of chromium, and consequently, stress is much less likely to concentrate at a part of the coating layer 11. The phrase that "the content ratio of chromium becomes so higher as to be expressed by arithmetic progression" denotes that the content ratios of chromium in the individual layers are roughly located on a straight line as illustrated in FIG. 5.

The content ratios of chromium in the individual layers need not be strictly located on the straight line. If the content ratio of chromium in the AlCr layer 15 located closest to the base member 9 is connected to the content ratio of chromium in the AlCr layer 15 located farthest away from the base member 9, the content ratios of chromium in the individual AlCr layers 15 may have a value in a range of 90-110% relative to a strict value indicated by the straight line.

From the viewpoint of enhancing adhesion while keeping the excellent wear resistance and durability of the coating layer 11, the content ratios of chromium in the AlCr layers 5 may become higher as going farther away from the base member 9 so as to be expressed by arithmetic progression. This is because the toughness of the AlCr layer 15 located relatively closer to the base member 9 is less likely to change significantly because of a small difference in content ratio of chromium in the AlCr layers 15 adjacent to each other with the AlTi layer 13 interposed therebetween in the thickness direction on a relatively near side of the base member 9.

Accordingly, because stress is less likely to be concentrated in a part of the AlCr layer 15 located relatively close to the base member 9, these AlCr layers 15 are less likely to separate, thereby further enhancing the adhesion of the coating layer 11.

The AlCr layers 15 individually include aluminum and chromium as a main component in the non-limiting embodiments. A content ratio of aluminum is settable to, for example, 20-60%. A content ratio of chromium is settable to, for example, 40-80%.

The content ratio of aluminum may be higher than the content ratio of chromium in each of the AlCr layers 15. The content ratio of chromium may be higher than the content ratio of aluminum in each of the AlCr layers 15.

The content ratio of aluminum may be higher than the content ratio of chromium in one of AlCr layers 15 which is closest to the base member 9. The content ratio of chromium may be higher than the content ratio of aluminum in one of the AlCr layers 15 which is farthest away from the base member 9.

Because hardness of aluminum is lower than hardness of chromium and toughness of aluminum is higher than toughness of chromium, the adhesion of the coating layer 11 can be more enhanced if the content ratio of aluminum is higher than the content ratio of chromium in one of the AlCr layers 15 which is located closest to the base member 9.

Additionally, because hardness of aluminum is lower than hardness of chromium and wear resistance of chromium is higher than wear resistance of aluminum, the wear resistance of the coating layer 11 can be more enhanced if the content ratio of chromium is higher than the content ratio of aluminum in the AlCr layer 15 which is located farthest away from the base member 9 among the AlCr layers 15.

As described earlier, the AlTi layer 13 includes aluminum and titanium, specifically, the AlTi layer 13 includes aluminum and titanium as a main component. If the AlTi layer 13 includes chromium at a ratio smaller than content ratios of aluminum and titanium, joining properties between the AlTi layer 13 and the AlCr layer 15 can be enhanced without significantly affecting the characteristic of the AlTi layer 13. Hence, the durability of the coating layer 11 can be further enhanced.

In particular, the durability of the coating layer 11 can be still further enhanced if the AlTi layers 13 include the first AlTi layer 13a and the second AlTi layer 13b located farther away from the base member 9 than the first AlTi layer 13a, and the content ratio of chromium in the second AlTi layer 13b is higher than the content ratio of chromium in the first AlTi layer 13a.

The reason for this is as follows. If the AlTi layer 13 includes chromium as in the AlCr layer 15, affinity between the AlCr layer 15 and the AlTi layer 13 can be enhanced, thus leading to enhanced joining properties between the AlCr layer 15 and the AlTi layer 13. Furthermore, if the content ratio of chromium is relatively high in the second AlTi layer 13b more susceptible to a large cutting load than the first AlTi layer 13a during a cutting process because the second AlTi layer 13b is located farther away from the base member 9 than the first AlTi layer 13a, joining properties in the second AlTi layer 13b with respect to the AlCr layer 15 adjacent thereto can be further enhanced than in the first AlTi layer 13a.

Although the coated tool 1 has the quadrangular plate shape as illustrated in FIG. 1 in the non-limiting embodiments, the shape of the coated tool 1 is not limited thereto. There is no problem even if the first surface 3 does not have the quadrangular shape but may have, for example, a hexagonal shape or circular shape.

The coated tool 1 includes a through hole 17 as illustrated in FIG. 1 in the non-limiting embodiments. The through hole 17 is extended from the first surface 3 to the surface located on the opposite side of the first surface 3 in the non-limiting embodiments, and the through hole 17 opens into these surfaces. The through hole 17 is usable for attaching a screw or clamping member when holding the coated tool 1 onto a holder. There is no problem even if the through hole 17 opens into regions located on opposite sides in the second surface 5.

Examples of material of the base member 9 include inorganic materials, such as cemented carbide, cermet and ceramics. Examples of composition of cemented carbide include WC(tungsten carbide)—Co, WC—TiC(titanium carbide)—Co and WC—TiC—TaC(tantalum carbide)—Co. Specifically, WC, TiC and TaC are hard particles, and Co is a binding phase. The cermet is a sintered composite material obtainable by compositing metal into a ceramic component. Specific examples of the cermet include compounds composed mainly of TiC or TiN (titanium nitride). The material of the base member 9 is not limited to these materials.

The coating layer 11 can be located on the base member 9 by using, for example, physical vapor deposition (PVD) method. In cases where the coating layer 11 is deposited with the base member 9 held on an inner peripheral surface of the through hole 17 by using the above vapor deposition method, the coating layer 11 can be located so as to cover the entirety of the surface of the base member 9 except for the inner peripheral surface of the through hole 17.

Examples of the physical deposition method includes ion plating method and sputtering method. As one non-limiting embodiment of the deposition with the ion plating method, the coating layer 11 can be deposited with the following method.

In a first procedure, a metal target independently including aluminum and titanium, a composite alloy target or a sintered body target is prepared. The above target serving as a metal source is vaporized and ionized by an arc discharge and a glow discharge. The ionized target is reacted with nitrogen ($N_2$) gas as a nitrogen source, and methane ($CH_4$) gas or acetylene ($C_2H_2$) gas as a carbon source, and is deposited on the surface of the base member 9. The AlTi layer 13 is formable through the above procedure.

In a second procedure, a metal target independently including aluminum and chromium, a composite alloy target or a sintered body target is prepared. The above target serving as a metal source is vaporized and ionized by an arc discharge and a glow discharge. The ionized target is reacted with nitrogen (N$_2$) gas as a nitrogen source, and methane (CH$_4$) gas or acetylene (C$_2$H$_2$) gas as a carbon source, and is deposited on the surface of the base member 9. The AlCr layer 15 is formable through the above procedure.

The coating layer configured so that a plurality of AlTi layers 13 and a plurality of AlCr layers 15 are alternately laminated one upon another is formable by alternately repeating the first procedure and the second procedure. There is no problem even if the first procedure is carried out after the second procedure.

A plurality of AlCr layers 15 including the first AlCr layer 15a and the second AlCr layer 15b are manufacturable by changing a ratio of chromium in the target used when repeating the second procedure. Specifically, a plurality of AlCr layers 15 including the first AlCr layer 15a and the second AlCr layer 15b are manufacturable by increasing the ratio of chromium in a middle of a repeated execution of the second procedure.

It is possible to ensure that the AlCr layer 15 located farther away from the base member 9 has a higher content ratio of chromium by, for example, gradually changing the ratio of chromium from the first execution of the second procedure to the final execution of the second procedure when repeating the second procedure.

A cutting tool 101 according to a non-limiting embodiments is described below with reference to the drawings.

Figure 6:
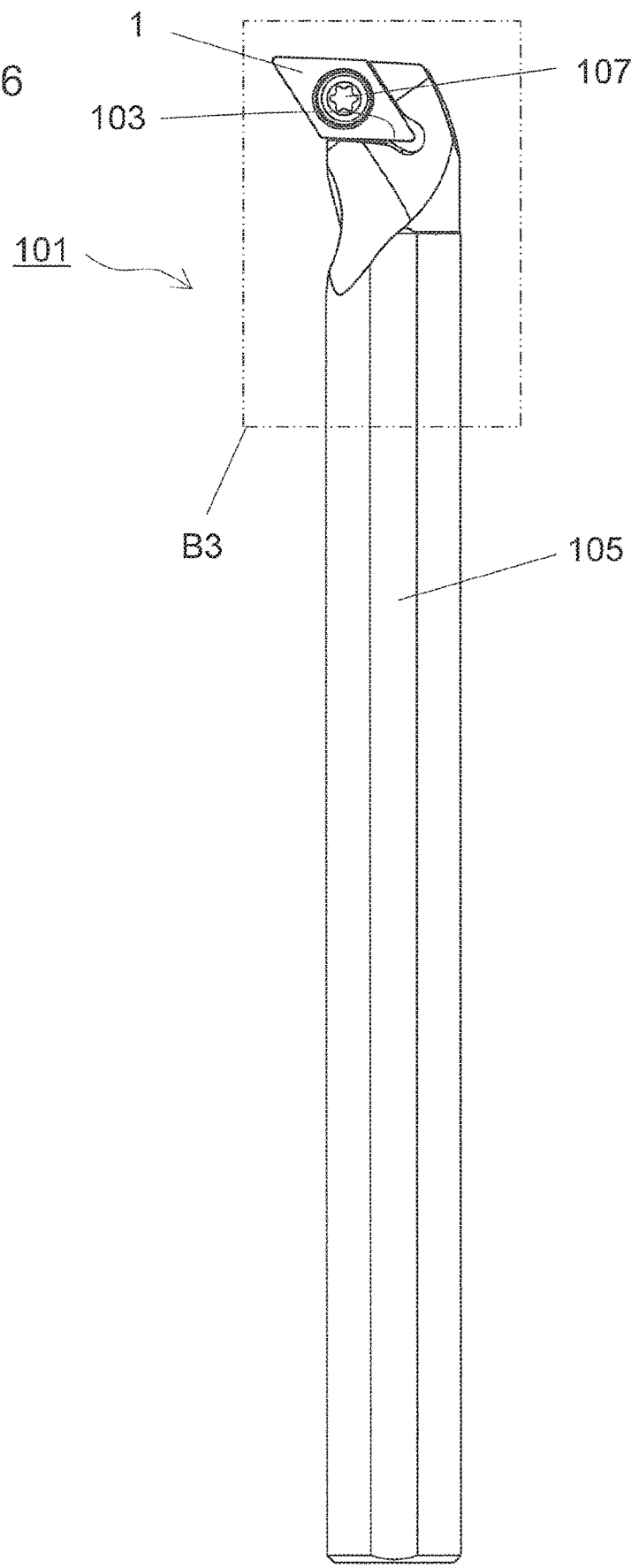
FIG. 6 is a plan view illustrating a cutting tool according to a non-limiting embodiment.
Figure 7:
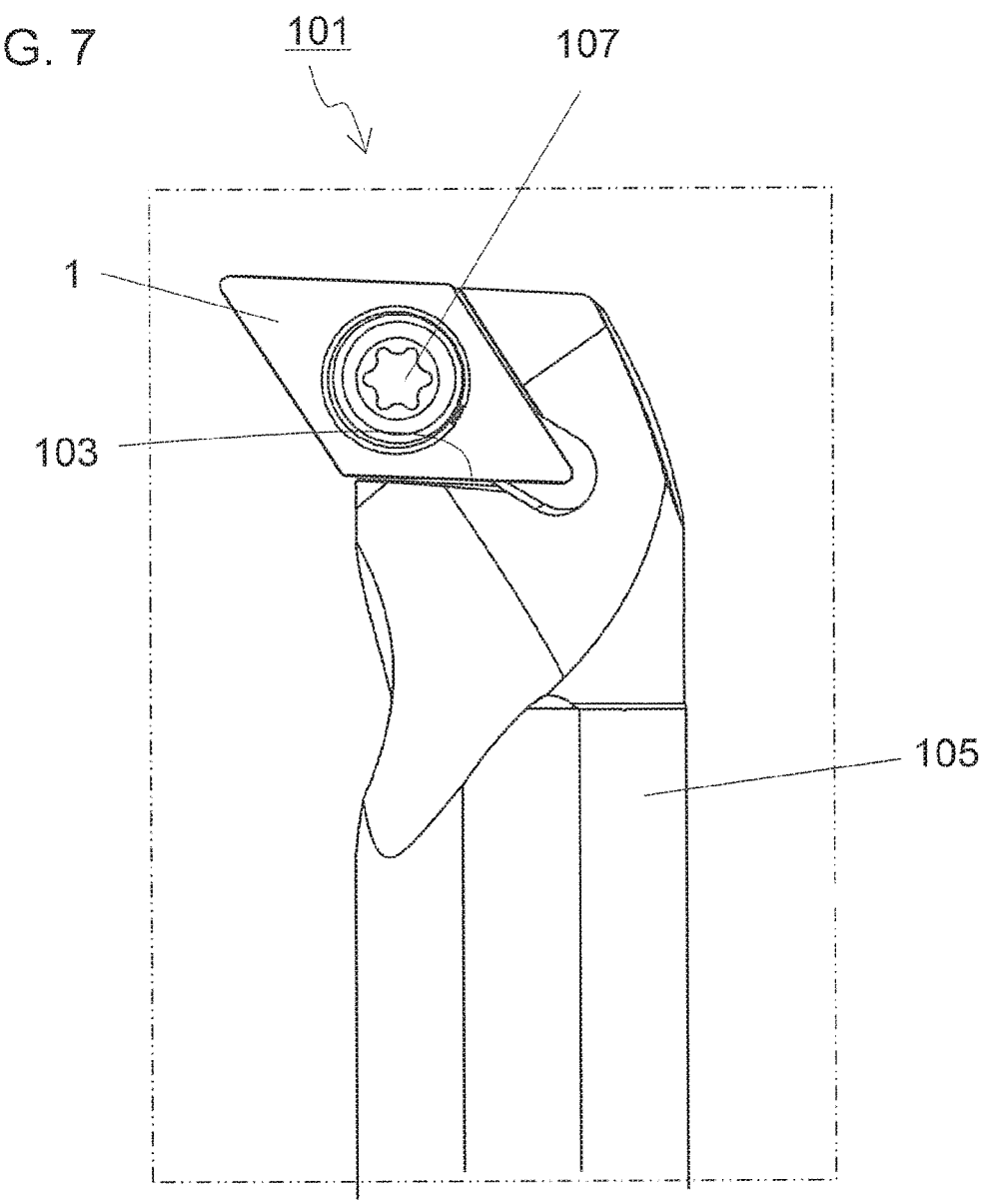
FIG. 7 is an enlarged view of a region B3 illustrated in FIG. 6.

As illustrated in FIG. 6, the cutting tool 101 in the non-limiting embodiment is a bar-shaped body extended from a first end (an upper end in FIG. 6) to a second end (a lower end in FIG. 6). As illustrated in FIG. 7, the cutting tool 101 includes a holder 105 with a pocket 103 located at a side of the first end, and the coated tool 1 located in the pocket 103.

The pocket 103 is a part that permits attachment of the coated tool 1. The pocket 103 includes a seating surface parallel to a lower surface of the holder 105, and a constraining side surface inclined relative to the seating surface. The pocket 103 opens into a side of the first end of the holder 105.

The coated tool 1 is located in the pocket 103. A lower surface of the coated tool 1 may be in a direct contact with the pocket 103. Alternatively, a sheet (not illustrated) may be held between the coated tool 1 and the pocket 103.

The coated tool 1 is attached so that at least a part of a ridge line where a first surface intersects with a second surface, which is usable as a cutting edge, is protruded outward from the holder 105. The coated tool 1 is attached to the holder 105 by a fixing screw 107 in the non-limiting embodiment. Specifically, the coated tool 1 is attachable to the holder 105 in such a manner that screw parts are engaged with each other by inserting the fixing screw 107 into the through hole of the coated tool 1, and by inserting a front end of the fixing screw 107 into a screw hole (not illustrated) formed in the pocket 103.

For example, steel and cast iron are usable as the holder 105. Of these materials, high toughness steel is may be used.

The non-limiting embodiments have illustrated and described the cutting tools for use in the so-called turning process. Examples of the turning process include inner diameter processing, outer diameter processing and grooving process. The cutting tools are not limited to ones which are used for the turning process. For example, the coated tools 1 of the above non-limiting embodiments are applicable to cutting tools for use in a milling process.

DESCRIPTION OF THE REFERENCE NUMERALS 1 coated tool
3 first surface
3a rake surface region
5 second surface
5a flank surface region
7 cutting edge
9 base member
11 coating layer
13 AlTi layer
13a first AlTi layer
13b second AlTi layer
15 AlCr layer
15a first AlCr layer
15b second AlCr layer
15c third AlCr layer
17 through hole
101 cutting tool
103 pocket
105 holder
107 fixing screw

What is claimed is:

1. A coated tool, comprising:
a base member; and
a coating layer located on the base member, wherein the coating layer comprises:
  a plurality of AlTi layers comprising a compound selected from the group consisting of: nitride, carbide, carbonitride, and combinations thereof, each of the plurality of AlTi layers further comprising aluminum and titanium, and
  three or more AlCr layers comprising a compound selected from the group consisting of: nitride, carbide, carbonitride, and combinations thereof, each of the three or more AlCr layers further comprising aluminum and chromium,
  a laminate structure in which the plurality of AlTi layers and the three or more AlCr layers are alternately laminated one upon another;
the three or more of AlCr layers have a content ratio of chromium that increases going farther away from the base member.

2. The coated tool according to claim 1, wherein a content ratio of chromium in the three or more AlCr layers increases going farther away from the base member so as to be expressed by arithmetic progression.

3. The coated tool according to claim 1, wherein a content ratio of aluminum is higher than a content ratio of chromium in an AlCr layer of the three or more AlCr layers that is located closest to the base member, and a content ratio of chromium is higher than a content ratio of aluminum in an AlCr layer of the three or more AlCr layers that is located farthest away from the base member.

4. The coated tool according to claim 1, wherein the plurality of AlTi layers further comprise chromium, and a content ratio of chromium in the plurality of AlTi layers is lower than a content ratio of aluminum and titanium.

5. The coated tool according to claim 4, wherein
the plurality of AlTi layers comprise a first AlTi layer and a second AlTi layer located farther away from the base member than the first AlTi layer, and
a content ratio of chromium in the second AlTi layer is higher than a content ratio of chromium in the first AlTi layer.

6. A cutting tool, comprising:
a holder comprising a pocket located at a side of a front end of the holder; and
the coated tool according to claim 1, which is located in the pocket.

\* \* \* \* \*